(12) United States Patent
Jang et al.

(10) Patent No.: US 12,069,912 B2
(45) Date of Patent: Aug. 20, 2024

(54) LIGHT EMITTING DISPLAY APPARATUS INCLUDING DRIVING THIN FILM TRANSISTOR DISPOSED IN EMISSION AREA

(71) Applicant: LG Display Co., Ltd., Seoul (KR)

(72) Inventors: Hun Jang, Paju-si (KR); Daeyoung Seo, Paju-si (KR); Soyoung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 397 days.

(21) Appl. No.: 17/461,224

(22) Filed: Aug. 30, 2021

(65) Prior Publication Data

US 2022/0085134 A1 Mar. 17, 2022

(30) Foreign Application Priority Data

Sep. 11, 2020 (KR) .................. 10-2020-0116551

(51) Int. Cl.
*H01L 29/08* (2006.01)
*G09G 3/3225* (2016.01)
*H10K 59/121* (2023.01)
*H10K 59/131* (2023.01)

(52) U.S. Cl.
CPC ......... *H10K 59/131* (2023.02); *G09G 3/3225* (2013.01); *H10K 59/1213* (2023.02); *H10K 59/1216* (2023.02)

(58) Field of Classification Search
CPC ............. H10K 59/131; H10K 59/1216; H10K 59/1213; G09G 3/3225

USPC .......................................................... 257/40
See application file for complete search history.

(56) References Cited

U.S. PATENT DOCUMENTS

| 9,608,009 B2 | 3/2017 | Park et al. | |
|---|---|---|---|
| 10,811,468 B2 | 10/2020 | Lee | |
| 2016/0349904 A1* | 12/2016 | Miyake | G06F 3/0446 |
| 2018/0129352 A1* | 5/2018 | Kim | G06F 3/0446 |
| 2018/0151120 A1* | 5/2018 | Kim | G09G 3/3291 |
| 2019/0348488 A1* | 11/2019 | Terai | H10K 50/865 |

FOREIGN PATENT DOCUMENTS

| CN | 112086466 A * | 12/2020 | ....... H01L 21/02631 |
|---|---|---|---|
| EP | 3340223 A1 * | 6/2018 | .......... G09G 3/3233 |
| KR | 2000-0038925 A | 7/2000 | |
| KR | 20150027486 A * | 3/2015 | .......... H10K 59/131 |
| KR | 10-1844284 B1 | 4/2018 | |
| KR | 10-2019-0038150 A | 4/2019 | |
| KR | 10-2019-0138179 A | 12/2019 | |
| KR | 10-2019-0140715 A | 12/2019 | |
| KR | 10-2020-0022067 A | 3/2020 | |
| KR | 102514820 B1 * | 3/2023 | .......... H10K 59/131 |
| WO | WO-2021157791 A1 * | 8/2021 | .......... G09G 3/3208 |

* cited by examiner

*Primary Examiner* — Phuc T Dang
(74) *Attorney, Agent, or Firm* — Birch, Stewart, Kolasch & Birch, LLP

(57) ABSTRACT

A light emitting display device includes a substrate, a pixel area having an emission area and a non-emission area on the substrate, a light emitting diode disposed in the pixel area, and a pixel driving circuit electrically connected with the light emitting diode and having a driving thin film transistor disposed in the emission area, wherein light emitted from the light emitting diode can be emitted to the outside of the substrate by passing through the substrate.

21 Claims, 9 Drawing Sheets

(a) Aperture ratio (Avg): 36.7%

(b) Aperture ratio (Avg): 53.9%

LIGHT EMITTING DISPLAY APPARATUS INCLUDING DRIVING THIN FILM TRANSISTOR DISPOSED IN EMISSION AREA

CROSS-REFERENCE TO RELATED APPLICATIONS

This application claims the priority benefit of the Korean Patent Application No. 10-2020-0116551 filed on Sep. 11, 2020 in Republic of Korea, the entire contents of which are hereby expressly incorporated by reference into the present application as if fully set forth herein.

BACKGROUND OF THE INVENTION

Field of the Invention

The present disclosure relates to a light emitting display device.

Discussion of the Related Art

With the advancement of the information age, the demand for a display device for displaying an image has increased with various forms. Therefore, various types of display devices such as a liquid crystal display (LCD) device, a plasma display panel (PDP) device, and an organic light emitting display (OLED) device have been recently used.

Among such display devices, the organic light emitting display device is a self-luminance display device using an organic light emitting diode which injects holes from an anode and electrons from a cathode into a light emitting layer and emits light when an exciton generated by combination of the injected holes and electrons changes its state from an excited state to a ground state.

The organic light emitting display device can be categorized into a top emission type, a bottom emission type, and a dual emission type depending on an emitted direction of light, and can be categorized into a passive matrix type and an active matrix type depending on a driving method.

The organic light emitting display device does not need a separate light source unlike a liquid crystal display (LCD) device and thus can be manufactured into a lightweight and thin form. Further, the organic light emitting display device can be advantageous in view of power consumption since it is driven with a low voltage. Further, the organic light emitting display device has excellent color expression ability, a high response speed, a wide viewing angle, and a high contrast ratio (CR). Therefore, the organic light emitting display device has been researched as the next-generation display device.

The organic light emitting display device generally includes a storage capacitor to maintain a certain current when emitting light. The storage capacitor is provided per pixel and occupies a certain area, whereby an aperture ratio can be reduced. The aperture ratio has recently become an important issue in accordance with the trend of high resolution of the display device. A current density of the light emitting diode can be lowered by enhancing the aperture ratio, whereby lifespan of the light emitting diode can be increased, and adaptability of the display device of high resolution can be enhanced. In this respect, an organic light emitting display device having a high aperture ratio is desired.

SUMMARY OF THE INVENTION

The present disclosure has been made in view of the above issues, and it is an object of the present disclosure to provide a light emitting display device that can improve an aperture ratio, simplify a structure and improve uniformity of a capacitor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display device comprising a substrate, a pixel area having an emission area and a non-emission area on the substrate, a light emitting diode disposed in the pixel area, and a pixel driving circuit electrically connected with the light emitting diode, having a driving thin film transistor disposed in the emission area, wherein light emitted from the light emitting diode can be emitted to the outside of the substrate by passing through the substrate.

In accordance with another aspect of the present disclosure, the above and other objects can be accomplished by the provision of a light emitting display device comprising a substrate including a pixel area having an emission area and a non-emission area, a light emitting diode having a first electrode disposed in the emission area, and a pixel driving circuit electrically connected to the first electrode of the light emitting diode, wherein the pixel driving circuit can include a switching circuit disposed in the non-emission area, a driving thin film transistor overlapped with the emission area and connected to the switching circuit and the light emitting diode, and a capacitor disposed in the emission area and formed between the switching circuit and the driving thin film transistor.

In accordance with other aspect of the present disclosure, the above and other objects can be accomplished by the provision of a light emitting display device comprising a substrate, and pixels respectively connected to gate lines and data lines on the substrate, wherein each of the pixels can include a light emitting diode including a first electrode, a driving thin film transistor disposed below the first electrode and connected to the light emitting diode, a switching circuit connected to gate and data lines adjacent thereto and the driving thin film transistor and non-overlapped with the first electrode, and a capacitor formed between the switching circuit and the driving thin film transistor.

The light emitting display device according to the present disclosure can be embodied such that the driving thin film transistor and the capacitor are disposed in the opening area of each subpixel, whereby an aperture ratio can be improved, a structure can be simplified, and uniformity of the capacitor can be improved. As a result, display performance can be improved by luminance increase based on improvement of the aperture ratio, and lifespan of the light emitting diode can be improved. Further, picture quality of a display image can be improved by deviation decrease based on uniformity improvement of the capacitor.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
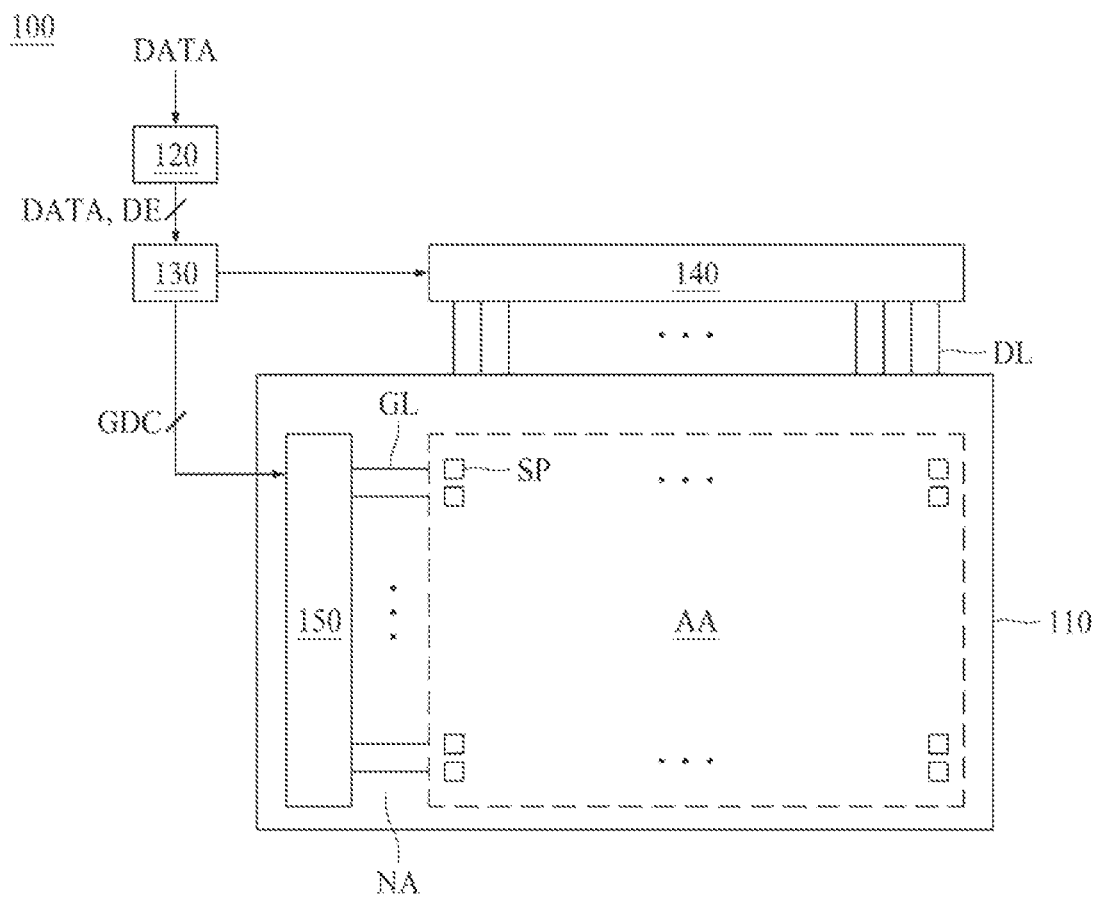
FIG. 1 is a schematic block view illustrating a light emitting display device according to various embodiments of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are merely used to partition one element from another and may not define order. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and can be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, one or more embodiments of a display device according to the present disclosure will be described in detail with reference to the accompanying drawings. All the components of each display device according to all embodiments of the present disclosure are operatively coupled and configured. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
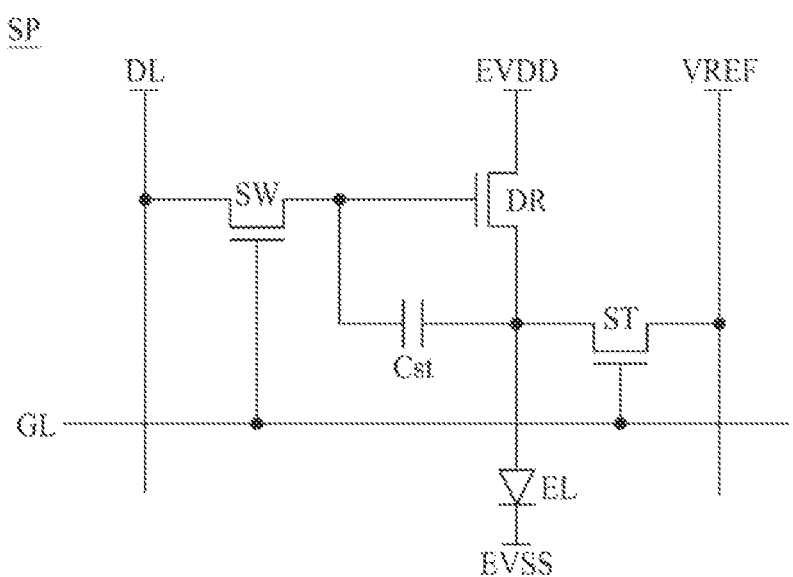
FIG. 2 is an equivalent circuit view illustrating an example of a subpixel of a light emitting display device according to various embodiments of the present disclosure.
Figure 3:
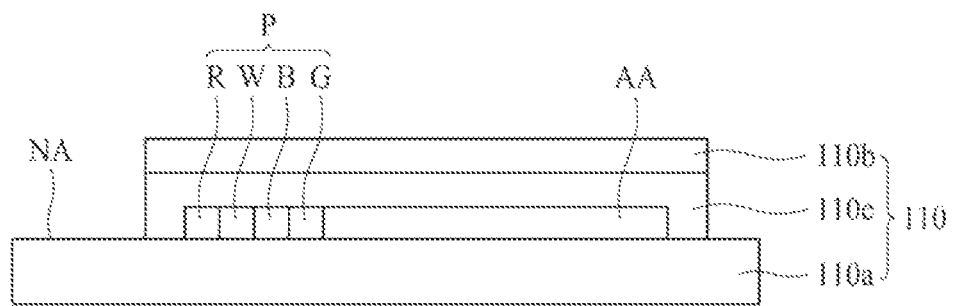
FIG. 3 is a sectional view illustrating an example of a display panel of a light emitting display device according to various embodiments of the present disclosure.

FIG. 1 is a schematic block view illustrating a light emitting display device according to various embodiments of the present disclosure, FIG. 2 is an equivalent circuit view illustrating an example of a subpixel of a light emitting display device according to various embodiments of the present disclosure, and FIG. 3 is a sectional view illustrating an example of a display panel of a light emitting display device according to various embodiments of the present disclosure.

Referring to FIGS. 1 to 3, a light emitting display device 100 according to various embodiments of the present disclosure can include a display panel 110, an image processor 120, a timing controller 130, a data driver 140, and a scan driver 150.

The display panel 110 can display an image in response to a data signal DATA and a scan signal, which are respectively supplied from the data driver 140 and the scan driver 150. The display panel 100 can include subpixels SP that operate to display an image.

The display panel 110 can include the subpixel SP disposed per intersection area between a plurality of gate lines GL and a plurality of data lines DL, and a structure of the subpixel SP can be changed in various ways depending on types of the display device 100.

For example, the subpixel SP can be formed in a top-emission type, a bottom-emission type, or a dual-emission type in accordance with a structure. The subpixels SP can include a red subpixel, a green subpixel, and a blue subpixel, or can include a red subpixel, a blue subpixel, a white subpixel and a green subpixel. The subpixels SP can have one or more different emission areas in accordance with light emission characteristics.

One or more subpixels SP can constitute one unit pixel. For example, one unit pixel can include red, green, blue and white subpixels, wherein red, green, blue and white subpixels can repeatedly be disposed, or red, green, blue and white subpixels can be disposed in a quad type. For example, according to the quad type arrangement, blue and red subpixels can respectively be disposed in a first scan line, and green and white subpixels can respectively be disposed in a second scan line. However, in various examples according to the present disclosure, a color type, an arrangement type, an arrangement sequence, etc. of the subpixels can be configured in various formats in accordance with light emission characteristics, a lifespan of an element, spec of a device, etc. but are not limited thereto.

The display panel 110 can be categorized into a display area AA on which subpixels SP are disposed to display an image, and a non-display area NA in the vicinity of the display area AA, and the scan driver 150 can be packaged in the non-display panel NA of the display panel 110.

The image processor 120 can output a data enable signal DE together with the data signal DATA supplied from the outside. The image processor 120 can output one or more of a vertical synchronization signal, a horizontal synchronization signal and a clock signal in addition to the data enable signal DE, but these signals will be omitted without being shown for convenience of description.

The timing controller 130 can be supplied with the data signal DATA together with a driving signal, which includes the data enable signal DE or the vertical synchronization signal, the horizontal synchronization signal and the clock signal, from the image processor 120. The timing controller 130 can output a data timing control signal DDC for controlling an operation timing of the data driver 140 and a gate timing control signal GDC for controlling an operation timing of the scan driver 150 on the basis of the driving signal.

The data driver 140 can sample and latch the data signal DATA supplied from the timing controller 130 in response to the data timing control signal DDC supplied from the timing controller 130, convert the latched data signal into a gamma reference voltage and output the converted gamma reference voltage. The data driver 140 can output the data signal DATA through the data lines DL. The data driver 140 can be embodied in the form of an Integrated Circuit (IC).

The scan driver 150 can output the scan signal in response to the gate timing control signal GDC supplied from the timing controller 130. The scan driver 150 can output the scan signal through the gate lines GL. The scan driver 150 can be embodied in the form of an IC (Integrated Circuit), or can be embodied in the display panel 110 in a Gate In Panel (GIP) type.

As shown in FIG. 2, one subpixel SP constituting a unit pixel can include a switching thin film transistor SW (or first switching thin film transistor), a sensing thin frim transistor ST (or second switching thin film transistor), a driving thin film transistor DR, a capacitor Cst, and a light emitting diode EL, as a pixel driving circuit.

A gate electrode of the switching thin film transistor SW (or first switching thin film transistor) can be connected to the gate line GL, its first electrode (e.g., source electrode) can be connected to the data line DL, and its second electrode (e.g., drain electrode) can be connected to a gate electrode of the driving thin film transistor DR. The switching thin film transistor SW can perform a switching operation to store a data signal supplied through the data line DL in the capacitor Cst as a data voltage in response to the scan signal supplied through the gate line GL.

A gate electrode of the driving thin film transistor DR can be connected to the capacitor Cst, its first electrode (e.g., second source electrode electrode) can be connected to the first driving power line EVDD, and its second electrode (e.g., first source/drain electrode) can be connected to a first electrode (e.g., anode electrode or pixel electrode) of the light emitting diode EL. The driving thin film transistor DR can operate to flow a driving current between the first driving power line EVDD (e.g., high potential voltage) and a second driving power line EVSS (e.g., low potential voltage) in accordance with the data voltage stored in the capacitor Cst.

A first electrode (e.g., second capacitor electrode) of the capacitor Cst can be connected to the gate electrode of the driving thin film transistor DR, and its second electrode (e.g., first capacitor electrode) can be connected to the first electrode (e.g., anode electrode or pixel electrode) of the light emitting diode EL.

The first electrode (e.g., anode electrode or pixel electrode) of the light emitting diode EL can be connected to the second electrode (e.g., first source/drain electrode) of the driving thin film transistor DR, and its second electrode (e.g., cathode electrode or common electrode) can be connected to the second driving power line EVSS. For example, the light emitting diode EL can be an Organic Light Emitting Diode (OLED).

A gate electrode of the sensing thin film transistor ST (or second switching thin film transistor) can be connected to the gate line GL, its first electrode (e.g., source electrode) can be connected to a reference line VREF, and its second electrode (e.g., drain electrode) can be connected to the first electrode (e.g., anode electrode or pixel electrode) of the light emitting diode EL, which is a sensing node.

The sensing thin film transistor ST is a compensation circuit added to compensate for degradation or a threshold voltage of the driving thin film transistor DR and the light emitting diode EL. The sensing thin film transistor ST can acquire a sensing value for compensation. The sensing value acquired from the sensing thin film transistor ST can be transferred to an external compensation circuit, which is provided outside the subpixel, through the reference line VREF.

The gate electrodes of the sensing thin film transistor ST and the switching thin film transistor SW can commonly be connected to the gate line GL and thus can be turned on and turned off at the same time. For example, the gate electrodes of the sensing thin film transistor ST and the switching thin film transistor SW can have a common connection structure. The common connection structure of the gate electrodes can reduce the number of gate lines, and as a result, can avoid decrease of an aperture ratio, which is caused by addition of the compensation circuit.

Further, in the example of FIG. 2, although the subpixel of a 3T (Transistor) 1C (Capacitor) structure that includes the switching thin film transistor SW, the driving thin film transistor DR, the capacitor Cst, the light emitting diode EL, and the sensing thin film transistor ST has been described as an example, each subpixel can have a structure of 3T2C, 4T2C, 5T1C, 6T2C, etc. when the compensation circuit CC is added thereto.

As shown in FIG. 3, the display panel 110 can be manufactured in a bottom emission type for emitting light (displaying an image) in a direction of a first substrate 110a, for example, a lower side direction. The display panel 110 can include the first substrate 110a (or thin film transistor substrate), a display area AA, a non-display area NA, a second substrate 110b (or passivation substrate, passivation film), and an encapsulation layer 110c between the first substrate 110a and the second substrate 110b.

The subpixels formed based on the pixel driving circuit described with reference to FIG. 2 can be disposed in the display area AA. The subpixels disposed on the display area AA can be encapsulated by the first and second substrates 110a and 110b and the encapsulation layer 110c.

The subpixels can be disposed on the display area AA horizontally or perpendicularly in the order of red (R), white (W), blue (B) and green (G). The subpixels can constitute one unit pixel P of red (R), white (W), blue (B) and green (G). However, in various examples according to the present disclosure, a color type, an arrangement type, an arrangement sequence, etc. of the subpixels can be configured in various formats in accordance with light emission characteristics, a lifespan of an element, spec of a device, etc. but are not limited thereto.

Figure 4:
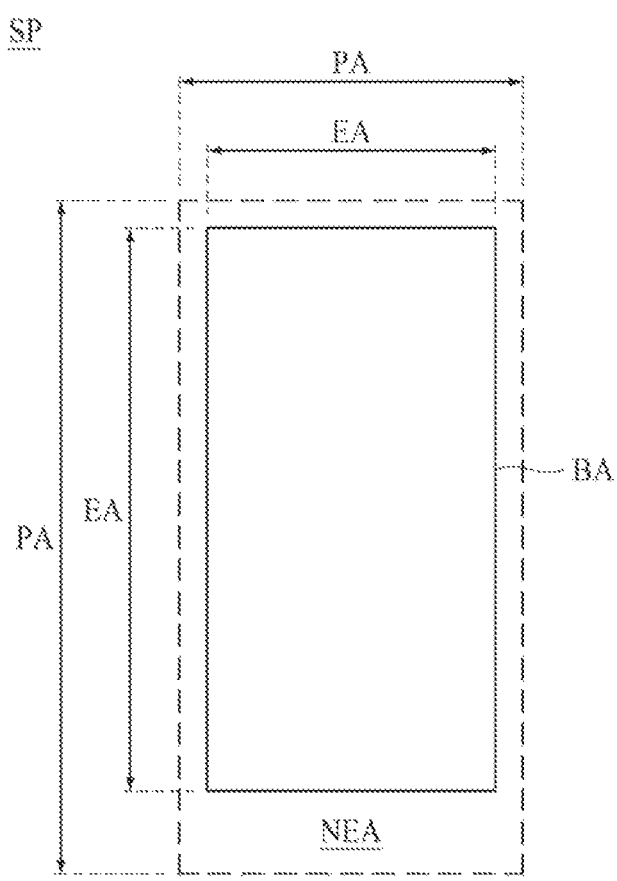
FIG. 4 is a schematic view illustrating an emission area of a subpixel of a light emitting display device according to various embodiments of the present disclosure.

FIG. 4 is a schematic view illustrating an emission area of a subpixel of a light emitting display device according to various embodiments of the present disclosure.

Referring to FIG. 4, the subpixel SP of the light emitting display device according to various embodiments of the present disclosure can include a pixel area PA having an emission area EA and a non-emission area NEA. The emission area EA of the subpixel SP can be an opening area defined by a bank BA, and the non-emission area NEA can be a cover area covered by the bank BA. The pixel driving circuit described in FIG. 2 can be disposed in the pixel area PA of the subpixel SP. For example, the subpixel SP can be any one of a red subpixel R, a blue subpixel B, a white subpixel W or a green subpixel G in accordance with a color of light emitted (image displayed) through the emission area EA, or three or four subpixels of different colors can constitute one unit pixel.

The subpixel SP can include a pixel area PA having an emission area EA and a non-emission area NEA on the first substrate 110a shown in FIG. 3. A first electrode PXL (e.g., anode electrode or pixel electrode), a light emitting layer (e.g., organic light emitting layer) and a second electrode (e.g., cathode electrode or common electrode) of the light emitting diode EL can be disposed in the pixel area PA of the subpixel SP. According to various embodiments of the present disclosure, the emission area EA of the subpixel SP can emit light emitted from the light emitting diode EL to the outside of the substrate 110a by passing through the substrate 110a. For example, the emission area EA of the subpixel SP can be provided in a bottom emission type for emitting light (displaying an image) in a direction of the first substrate 110a, for example, a lower side direction.

Since a typical bottom emission type light emitting display device emits light in a lower side direction, a pixel driving circuit is only disposed in the non-emission area NEA which does not correspond to the emission area EA, whereby a ratio of the non-emission area NEA provided with the pixel driving circuit can be increased in the entire pixel area PA, and a ratio of the emission area EA actually emitting light can be reduced. An emission area of the subpixel is an important factor that affects luminance, lifespan, a process margin, reliability, etc. of the display panel, but downsizing of the emission area EA enhances a density of a current flowing in the light emitting diode, whereby a reliability defect (e.g., residual image) can occur.

The inventors of the present disclosure suggest a bottom emission type light emitting display device of a new structure, which can increase a ratio of an emission area EA and downsize a ratio of a non-emission area NEA in an entire pixel area PA of a subpixel SP by allowing a portion of a pixel driving circuit disposed only in the non-emission area NEA of the subpixel SP to be disposed in the emission area EA.

In the light emitting display device according to various embodiments of the present disclosure, the driving thin film transistor DR included in the pixel driving circuit can be disposed in the emission area EA of the subpixel SP. The switching thin film transistor SW (or first switching thin film transistor) and the sensing thin film transistor ST (or second switching thin film transistor) can be disposed in the non-emission area NEA of the subpixel SP as switching circuits included in the pixel driving circuit. The capacitor Cst can be disposed between the driving thin film transistor DR and the switching circuit, which includes the switching thin film transistor SW and the sensing thin film transistor ST, in the emission area EA of the subpixel SP.

Hereinafter, the light emitting display device that can increase the ratio of the emission area EA in the pixel area PA of the subpixel SP in accordance with one embodiment of the present disclosure will be described in detail with reference to FIGS. 5 to 10.

Figure 5:
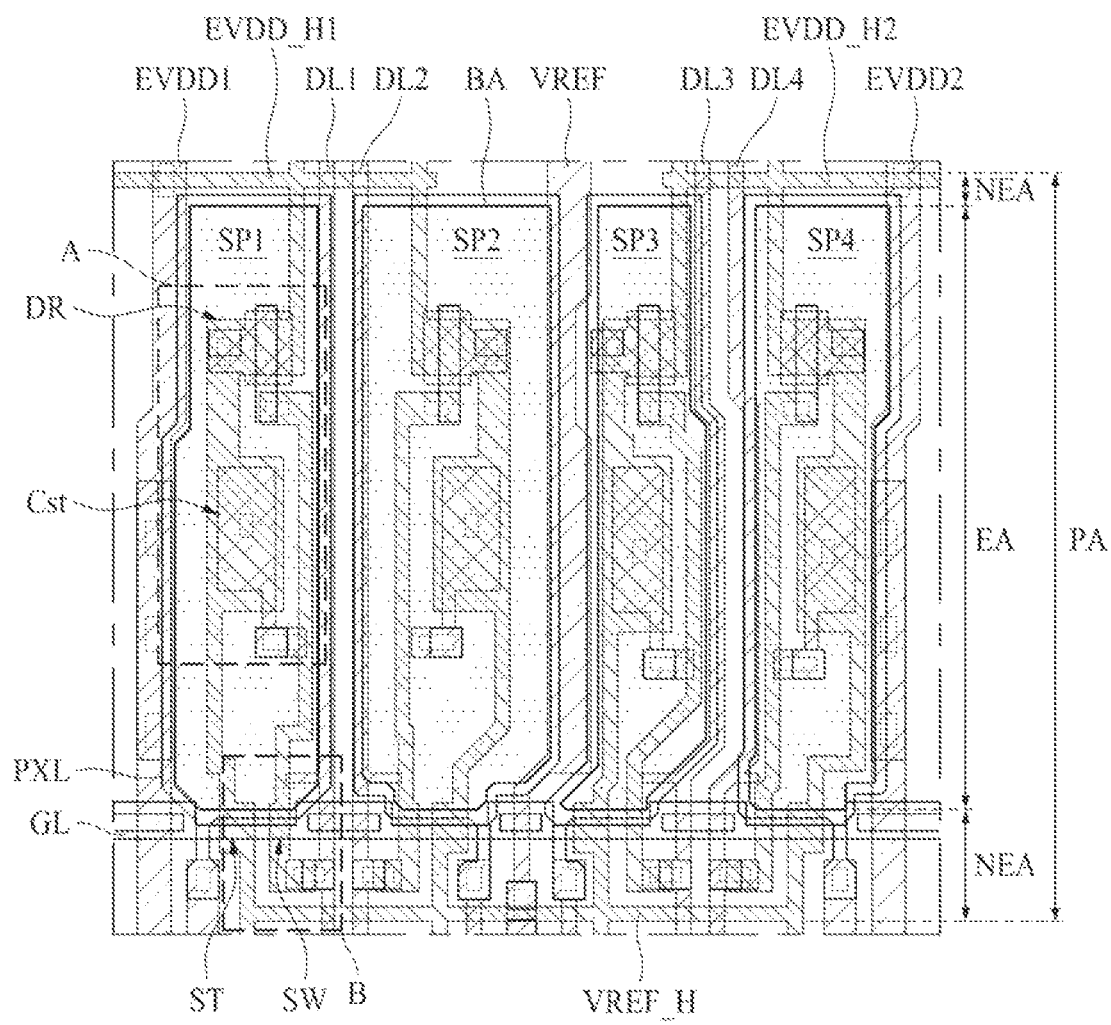
FIG. 5 is a detailed plane view illustrating a unit pixel of a light emitting display device according to various embodiments of the present disclosure.
Figure 6:
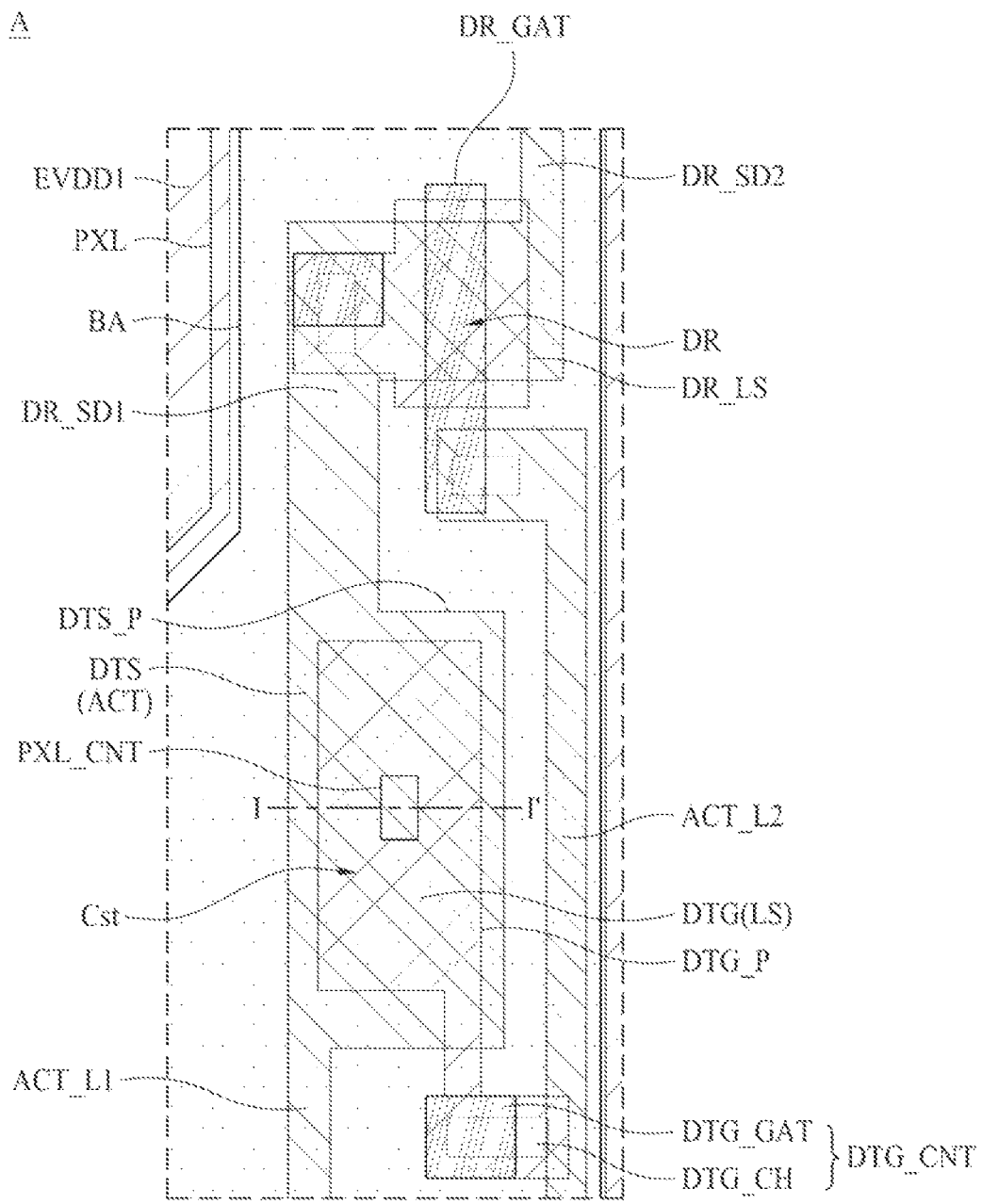
FIG. 6 is an enlarged view of a portion A of FIG. 5.
Figure 7:
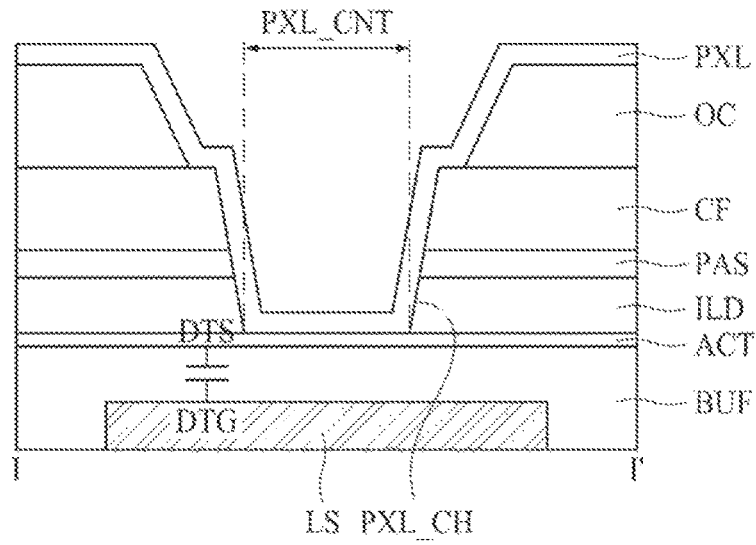
FIG. 7 is a cross-sectional view taken along line I-I' of FIG. 6.
Figure 8:
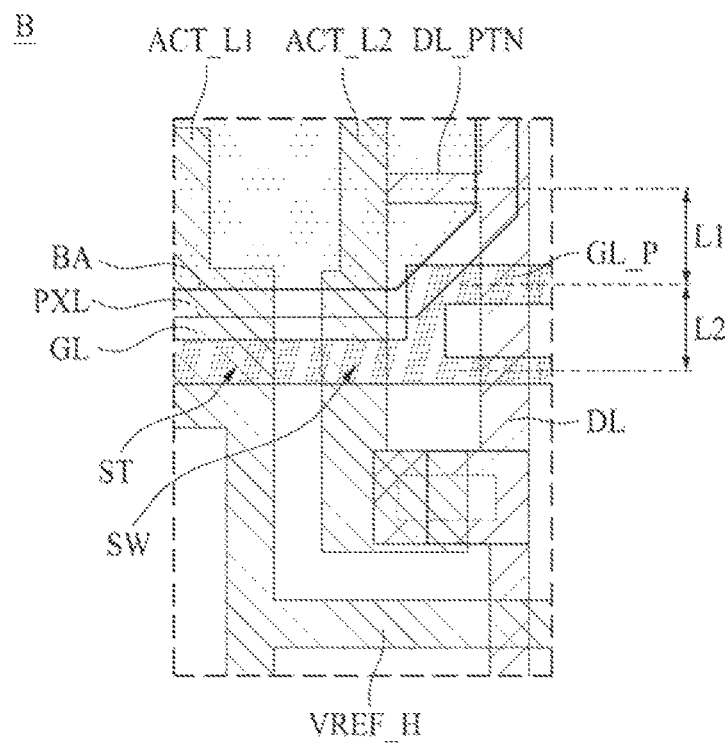
FIG. 8 is an enlarged view of a portion B of FIG. 5.
Figure 9:
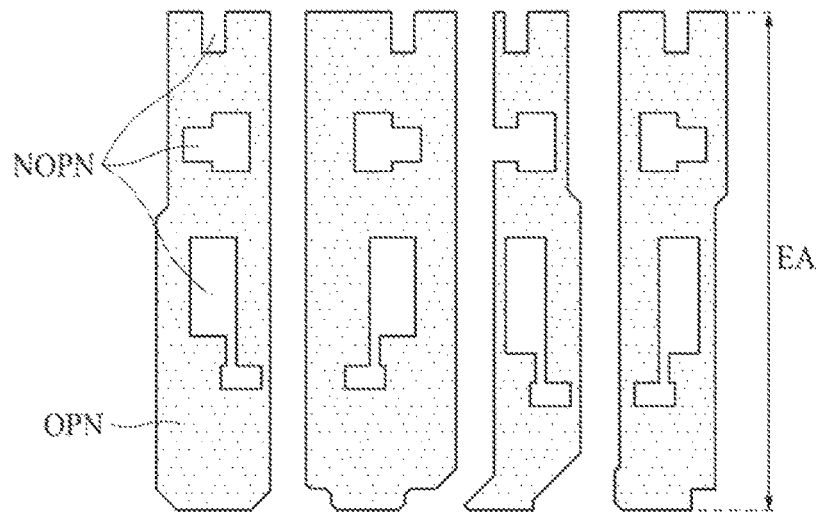
FIG. 9 is a view illustrating an emission area of a light emitting display device according to various embodiments of the present disclosure.
Figure 10:
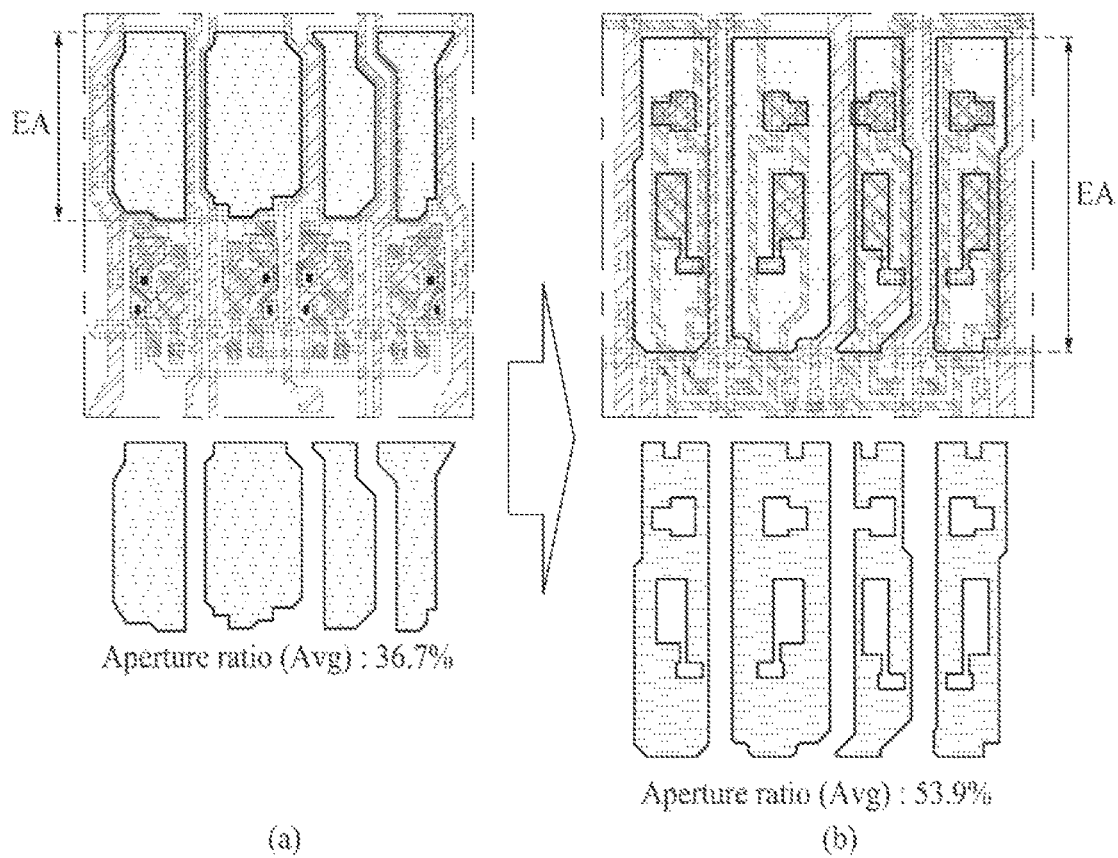
FIG. 10 is a view illustrating a light emitting display device according to various embodiments of the present disclosure and a comparative example.

FIG. 5 is a detailed plane view illustrating a unit pixel of a light emitting display device according to various embodiments of the present disclosure. FIG. 6 is an enlarged view of a portion A of FIG. 5. FIG. 7 is a cross-sectional view taken along line I-I' of FIG. 6. FIG. 8 is an enlarged view of a portion B of FIG. 5. FIG. 9 is a view illustrating an emission area of a light emitting display device according to various embodiments of the present disclosure. FIG. 10 is a view illustrating a light emitting display device according to various embodiments of the present disclosure and a comparative example.

Referring to FIG. 5, in the light emitting display device according to various embodiments of the present disclosure, a plurality of subpixels SP1, SP2, SP3 and SP4 each of which includes a pixel area PA having an emission area EA and a non-emission area NEA can be disposed. The plurality of subpixels SP1, SP2, SP3 and SP4 can constitute one unit pixel. For example, the first subpixel SP1 can be a red subpixel R, the second subpixel SP2 can be a white subpixel W, the third subpixel SP3 can be a blue subpixel B, and the fourth subpixel SP4 can be a green subpixel G, but the embodiment of the present disclosure is not limited thereto. Three subpixels SP1, SP2 and SP3, which include a red subpixel R, a green subpixel G and a blue subpixel B, can constitute a unit pixel. Further, various modifications can be made in arrangement of at least three or four subpixels included in the unit pixel. In the following description, subpixels of 3T1C will be described for convenience by way of example.

Gate lines GL and data lines DL1, DL2, DL3 and DL4 can be disposed in the pixel area PA of each of the subpixels SP1, SP2, SP3 and SP4, and the pixel area PA can include a first electrode PXL (e.g., anode electrode or pixel electrode) of the light emitting diode, a driving thin film transistor DR, a capacitor Cst, a switching thin film transistor SW (or first switching thin film transistor), and a sensing thin film transistor ST (or second switching thin film transistor).

The first electrode PXL of the light emitting diode, the driving thin film transistor DR, and the capacitor Cst can be disposed in the emission area EA of each of the subpixels SP1, SP2, SP3 and SP4, and the switching thin film transistor SW and the sensing thin film transistor ST can be disposed in the non-emission area NEA. The emission area EA of each of the subpixels SP1, SP2, SP3 and SP4 can be an opening area defined by the bank BA, and the non-emission area NEA can be a cover area covered by the bank BA. In the emission area EA, the first electrode PXL of the light emitting diode is exposed through the opening area of the bank BA, and the light emitting layer (e.g., organic light emitting layer) and the second electrode (e.g., cathode electrode or common electrode) of the light emitting diode are disposed on the first electrode PXL to emit light.

The driving thin film transistor DR can be disposed in a portion (e.g., upper side portion in the emission area) in the emission area EA, and the capacitor Cst can be disposed in the other portion (e.g., center portion in the emission area) in the emission area EA.

The driving thin film transistor DR can be disposed below the first electrode PXL of the light emitting diode overlapped with the emission area EA, and can be connected with the first electrode PXL of the light emitting diode in the emission area EA. Further, the driving thin film transistor DR can be connected to the switching circuit that includes the switching thin film transistor SW and the sensing thin film transistor ST, which are disposed in the non-emission area NEA.

The capacitor Cst can be disposed below the first electrode PXL of the light emitting diode overlapped with the emission area EA, and can be connected with the first electrode PXL of the light emitting diode in the emission area EA. Further, the capacitor Cst can be connected between the driving thin film transistor DR and the switching circuit in the emission area EA, wherein the switching circuit includes the switching thin film transistor SW and the sensing thin film transistor ST, which are disposed in the non-emission area NEA.

The switching circuit that includes the switching thin film transistor SW (or second switching thin film transistor) and the sensing thin film transistor ST (or second switching thin film transistor) can be disposed in the non-emission area NEA positioned at one side (e.g., lower side of the emission area) of the emission area EA. The switching thin film transistor SW and the sensing thin film transistor ST can be disposed in the non-emission area NEA that is not overlapped with the first electrode PXL. The switching thin film transistor SW and the sensing thin film transistor ST can be disposed in parallel along the gate line GL, and can use the gate line GL as a common gate electrode.

The switching thin film transistor SW (or first switching thin film transistor) can be connected to its adjacent data lines DL1, DL2, DL3 and DL4 in the non-emission area NEA, and can also be connected to the driving thin film transistor DR disposed in the emission area EA.

The sensing thin film transistor ST (or second switching thin film transistor) can be connected to the reference line VREF through a reference sharing line VREF_H in the non-emission area NEA, and can also be connected to the driving thin film transistor DR disposed in the emission area EA.

The plurality of subpixels SP1, SP2, SP3 and SP4 constituting one unit pixel can be disposed between the plurality of driving power lines EVDD1 and EVDD2, and can be delimited with a unit pixel adjacent thereto by the plurality of driving power lines EVDD1 and EVDD2. For example, the first driving power line EVDD1 can be positioned at a left side of the first subpixel SP1, and the second driving power line EVDD2 can be disposed at a right side of the fourth subpixel SP4. The first driving power line EVDD1 can include a first power sharing line EVDD_H1 extended in a horizontal direction and connected to the first subpixel SP1 and the second subpixel SP2, and the second driving power line EVDD2 can include a second power sharing line EVDD_H2 extended in a horizontal direction and connected to the third subpixel SP4 and the third subpixel SP3. The first driving power line EVDD1 can be connected to the driving thin film transistor DR disposed in the first subpixel SP1 and the second subpixel SP2 through the first power sharing line EVDD_H1, and the second driving power line EVDD2 can be connected to the driving thin film transistor DR disposed in the third subpixel SP3 and the fourth subpixel SP4 through the second power sharing line EVDD_H2.

The first power sharing line EVDD_H1 and the second power sharing line EVDD_H2 can be disposed in the non-emission area NEA positioned at the other side (for example, upper side of the emission area) of the emission area EA. For example, the first power sharing line EVDD_H1 and the second power sharing line EVDD_H2 can be covered by the bank BA. According to various embodiments of the present disclosure, the first power sharing line EVDD_H1 and the second power sharing line EVDD_H2 may not be separate elements spaced apart from each other but be elements connected with each other in a single body. In this case, one power sharing line extended in a horizontal direction to connect the first driving power line EVDD1 of the left side with the second driving power line EVDD2 of the right side can be included between the first driving power line EVDD1 and the second driving power line EVDD2.

The plurality of data lines DL1, DL2, DL3 and DL4 can be disposed in parallel between the first subpixel SP1 and the second subpixel SP2 and between the third subpixel SP3 and the fourth subpixel SP4 in the plurality of subpixels SP1, SP2, SP3 and SP4. Each of the plurality of data lines DL1, DL2, DL3 and DL4 can supply a data signal to the switching thin film transistor SW (or first switching thin film transistor) disposed in the non-emission area NEA of each of the subpixels adjacent thereto.

The reference line VREF can be disposed in parallel with the plurality of driving power lines EVDD1 and EVDD2 between the second subpixel SP2 and the third subpixel SP3 in the plurality of subpixels SP1, SP2, SP3 and SP4. The reference line VREF can include a reference sharing line VREF_H extended in a horizontal direction toward left and right sides. The reference line VREF can be connected to the sensing thin film transistor ST (or second switching thin film transistor) disposed in the non-emission area NEA of each of the subpixels through the reference sharing line VREF_H.

The gate line GL can be disposed along a horizontal direction in the non-emission area NEA of the plurality of subpixels SP1, SP2, SP3 and SP4. The gate line GL can be disposed to cross all of the non-emission areas NEA of the plurality of subpixels SP1, SP2, SP3 and SP4. The gate line GL can be disposed in the non-emission area NEA adjacent to a boundary of the emission area EA. The gate line GL can be connected to the gate electrode of each of the switching thin film transistor SW and the sensing thin film transistor ST, which are disposed in the non-emission area NEA, or can perform the role of the gate electrode.

The driving thin film transistor DR and the capacitor Cst disposed in the emission area EA in the light emitting display device according to various embodiments of the present disclosure will be described below with reference to FIGS. 6 and 7 in connection with FIG. 5.

As shown in FIG. 6, the first electrode PXL of the light emitting diode, the driving thin film transistor DR, and the capacitor Cst can be disposed in the emission area EA. The emission area EA can be an opening area defined by the bank BA.

The driving thin film transistor DR can be disposed below the first electrode PXL (e.g., anode electrode or pixel electrode) of the light emitting diode overlapped with the emission area EA. The driving thin film transistor DR can include a gate electrode DR_GAT connected to the switching circuit that includes the switching thin film transistor SW (or first switching thin film transistor) and the sensing thin film transistor ST (or second switching thin film transistor), a first source/drain electrode DR_SD1 connected to the first electrode PXL of the light emitting diode, and a second source/drain electrode DR_SD2 connected to the first driving power line EVDD1 through the first power sharing line EVDD_H1.

The gate electrode DR_GAT of the driving thin film transistor DR can be extended in parallel with the first driving power line EVDD1. The first source/drain electrode DR_SD1 and the second source/drain electrode DR_SD2 of the driving thin film transistor DR can be formed by conductorization of an active layer of the driving thin film transistor DR. The active layer of the driving thin film transistor DR is a transparent active layer, and can include an oxide semiconductor (e.g., IGZO). For example, a portion of the active layer of the driving thin film transistor DR, which corresponds to the first source/drain electrode DR_SD1 and the second source/drain electrode DR_SD2 except a portion corresponding to a channel area, can be conductorized to form a metal electrode, and a plasma or etching process can be used as a conductorizing process but the conductorizing process is not limited thereto.

A light shielding layer DR_LS can be disposed below the driving thin film transistor DR. The light shielding layer DR_LS of the driving thin film transistor DR can be formed to correspond to the channel area.

The capacitor Cst can be disposed below the first electrode PXL (e.g., anode electrode or pixel electrode) of the light emitting diode overlapped with the emission area EA. The capacitor Cst can be formed between the gate electrode DR_GAT and the first source/drain electrode DR_SD1 of the driving thin film transistor DR disposed in the emission area EA.

The capacitor Cst can include a first capacitor electrode DTS connected between the first source/drain electrode DR_SD1 of the driving thin film transistor DR and the sensing thin film transistor ST (or second switching thin film transistor) disposed in the non-emission area NEA, and a second capacitor electrode DTG connected between the gate electrode DR_GAT of the driving thin film transistor DR and the switching thin film transistor SW (or first switching thin film transistor) disposed in the non-emission area NEA and overlapped with the first capacitor electrode DTS.

The first capacitor electrode DTS of the capacitor Cst can include a first active line ACT_L1 connected between the first source/drain electrode DR_SD1 of the driving thin film transistor DR and the sensing thin film transistor ST, and a protrusion DTS_P protruded from the first active line ACT_L1. The first capacitor electrode DTS can be disposed on the same layer as the first source/drain electrode DR_SD1 of the driving thin film transistor DR, and can be made of the same material as that of the first source/drain electrode DR_SD1. The first capacitor electrode DTS can be formed by conductorization of the active layer extended from the driving thin film transistor DR. For example, in the first capacitor electrode DTS, the first active line ACT_L1 connecting the first source/drain electrode DR_SD1 of the driving thin film transistor DR with the sensing thin film transistor ST and the protrusion DTS_P protruded from the first active line ACT_L1 can be formed by conductorization of the active layer disposed on the same layer as the first source/drain electrode DR_SD1 of the driving thin film transistor DR.

The first capacitor electrode DTS can include a pixel connector PXL_CNT electrically connected with the first electrode PXL of the light emitting diode in the emission area EA. As shown in FIG. 7, an inter-layer dielectric layer ILD as at least one insulating layer, a passivation layer PAS, a color filter layer CF and an overcoat layer OC can be disposed between the first capacitor electrode DTS which is an active layer ACT and the first electrode PXL (e.g., anode electrode or pixel electrode) of the light emitting diode, and the first capacitor electrode DTS and the first electrode PXL can electrically be connected with each other through a contact hole PXL_CH that passes through the inter-layer dielectric layer ILD, the passivation layer PAS, the color filter layer CF and the overcoat layer OC.

The second capacitor electrode DTG of the capacitor Cst can include a second active line ACT_L2 connected between the gate electrode DR_GAT of the driving thin film transistor DR and the switching thin film transistor SW, an electrode pattern DTG_P overlapped with the protrusion DTS_P of the first capacitor electrode DTS, and an electrode connector DTG_CNT connecting the electrode pattern DTC_P with the second active line ACT_L2. The second active line ACT_L2 of the second capacitor electrode DTG can be disposed in parallel with the first active line ACT_L1 of the first capacitor electrode DTS. The protrusion DTS_P of the first capacitor electrode DTS can be disposed between the first active line ACT_L1 and the second active line ACT_L2.

The second active line ACT_L2 of the second capacitor electrode DTG can connect the gate electrode DR_GAT of the driving thin film transistor DR with the switching thin film transistor SW, and can be formed by conductorization of the active layer extended from the switching thin film transistor SW. At this time, active layers of the driving thin film transistor DR, the switching thin film transistor SW and the sensing thin film transistor ST can be disposed on the same layer, and can be made of the same material. For example, the active layer ACT is a transparent active layer, and can include an oxide semiconductor (e.g., IGZO).

The second capacitor electrode DTG can include a light shielding layer LS made of a light shielding metal material. The electrode pattern DTG_P of the second capacitor electrode DTG can be disposed below the protrusion DTG_P of the first capacitor electrode DTS to overlap the protrusion DTS_P. The electrode pattern DTG_P of the second capacitor electrode DTG can be disposed on the same layer as the light shielding layer DR_LS of the driving thin film transistor DR, and can be made of the same material as that of the light shielding layer DR_LS of the driving thin film transistor DR. The capacitor Cst can be formed between the protrusion DTS_P of the first capacitor electrode DTS and the electrode pattern DTG_P of the second capacitor electrode DTG. As shown in FIG. 7, an insulating layer (e.g., buffer layer) can be disposed between the second capacitor electrode DTG corresponding to the light shielding layer LS and the first capacitor electrode DTS corresponding to the active layer ACT, and the capacitor Cst can be formed between the first capacitor electrode DTS and the second capacitor electrode DTG, which are disposed by interposing the insulating layer therebetween.

The electrode connector DTG_CNT of the second capacitor electrode DTG can include a contact hole DTG_CH exposing one side of the electrode pattern DTG_P and one side of the second active line ACT_L2, and a connection pattern DTG_GAT electrically connected to one side of the electrode pattern DTG_P and one side of the second active line ACT_L2. The connection pattern DTG_GAT can be disposed on the same layer as the gate electrode DR_GAT of the driving thin film transistor DR, and can be made of the same material as that of the gate electrode DR_GAT of the driving thin film transistor DR.

The switching thin film transistor SW and the sensing thin film transistor ST, which are disposed in the non-emission area NEA in the light emitting display device according to various embodiments of the present disclosure, will be described in detail with reference to FIG. 8 in connection with FIG. 5.

As shown in FIG. 8, the gate line GL, the data line DL, the switching thin film transistor SW (or first switching thin film transistor) and the sensing thin film transistor ST (or second switching thin film transistor) can be disposed in the non-emission area NEA. The non-emission area NEA can be a cover area covered by the bank BA.

The gate line GL can be disposed to be extended along a horizontal direction in the non-emission area NEA. The gate line GL can be disposed to cross the non-emission area NEA. The gate line GL can be disposed in the non-emission area NEA adjacent to a boundary of the emission area EA. The gate line GL can be connected to the gate electrode of each of the switching thin film transistor SW and the sensing thin film transistor ST, which are disposed in the non-emission area NEA, or can perform the role of the gate electrode.

The data line DL can be disposed to be extended along a vertical direction crossing the gate line GL. A compensation pattern DL_PTN can be disposed in the data line DL to compensate for an influence of the scan signal transferred through the gate line GL. The compensation pattern DL_PTN of the data line DL can be disposed to be spaced apart from the gate line GL at the same distance by interposing a pattern portion GL_P of the gate line GL. For example, a distance L1 between the compensation pattern DL_PTN and the pattern portion GL_P of the gate line GL and a distance L2 between the gate line GL and the pattern portion GL_P of the gate line GL can substantially be equal to each other.

The switching thin film transistor SW (or first switching thin film transistor) can be connected with the data line DL, and can also be connected to the driving thin film transistor DR disposed in the emission area EA. The switching thin film transistor SW can be connected with the second active line ACT_L2 extended from the gate electrode DR_GAT of the driving thin film transistor DR. One side of the active layer of the switching thin film transistor SW can be connected with the data line DL, and the other side thereof can be connected with the second active line ACT_L2 by crossing the gate line GL. The switching thin film transistor SW can use the gate line GL crossing the active layer as the gate electrode.

The sensing thin film transistor ST (or second switching thin film transistor) can be connected with the reference line VREF through the reference sharing line VREF_H. Further, the sensing thin film transistor ST can be connected to the driving thin film transistor DR disposed in the emission area EA. The sensing thin film transistor ST can be connected with the first active line ACT_L1 extended from the first source/drain electrode DR_SD1 of the driving thin film transistor DR. One side of the active layer of the sensing thin film transistor ST can be connected with the reference sharing line VREF_H, and the other side thereof can be connected with the first active line ACT_L1 by crossing the gate line GL. The sensing thin film transistor ST can use the gate line GL crossing the active layer as the gate electrode.

The switching thin film transistor SW and the sensing thin film transistor ST can be disposed in parallel along the gate line GL, and can use the gate line GL as a common gate electrode. The active layers of the switching thin film transistor SW and the sensing thin film transistor ST can be disposed on the same layer as the active layer of the driving thin film transistor DR, and can be made of the same material as that of the active layer of the driving thin film transistor DR. For example, the active layer ACT is a transparent active layer, and can include an oxide semiconductor (e.g., IGZO).

Referring to FIG. 9, as the driving thin film transistor DR and the capacitor Cst are disposed, the emission area EA of the light emitting display device according to various embodiments of the present disclosure includes NOPN for not emitting light in an area corresponding to the light shielding layer DR_LS of the driving thin film transistor DR and the electrode pattern DTG_P of the capacitor Cst. However, since the non-emission area NEA is downsized, OPN for actually emitting light can be enlarged. As will be aware of it from FIG. 9, when subpixels are designed based on various embodiments of the present disclosure, an emission size can remarkably be increased by enlargement of the emission area EA.

Increase of the emission size of the light emitting display device according to various embodiments of the present disclosure can be more apparent with reference to FIG. 10. A left side (a) of FIG. 10 shows a comparative example as a typical light emitting display device of a bottom emission type, which includes a driving thin film transistor, a capacitor, a switching thin film transistor, and a sensing thin film transistor in the non-emission area NEA. A right side (b) of FIG. 10 shows a light emitting display device according to various examples of the present disclosure. For example, an average aperture ratio of subpixels is 36.7% in case of the comparative example, whereas an average aperture ratio of subpixels is 53.9% in case of various examples of the present disclosure, whereby it is noted that the average aperture ratio can remarkably be increased.

Figure 11:
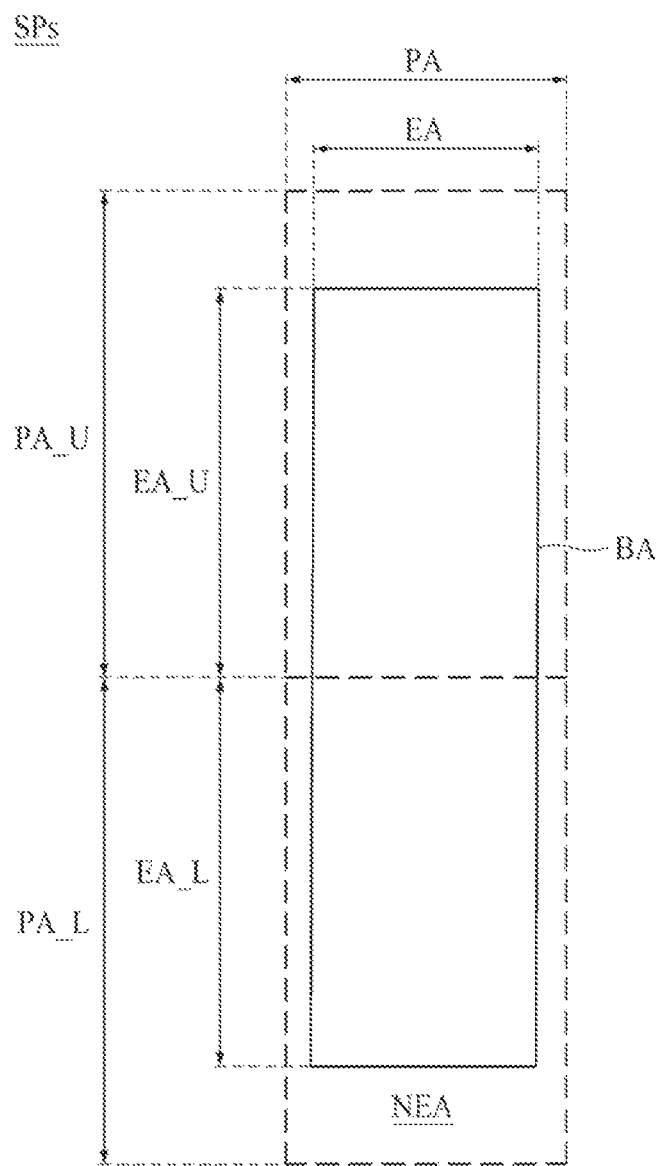
FIG. 11 is a schematic view illustrating an emission area of a plurality of subpixels of a light emitting display device according to various embodiments of the present disclosure.
Figure 12:
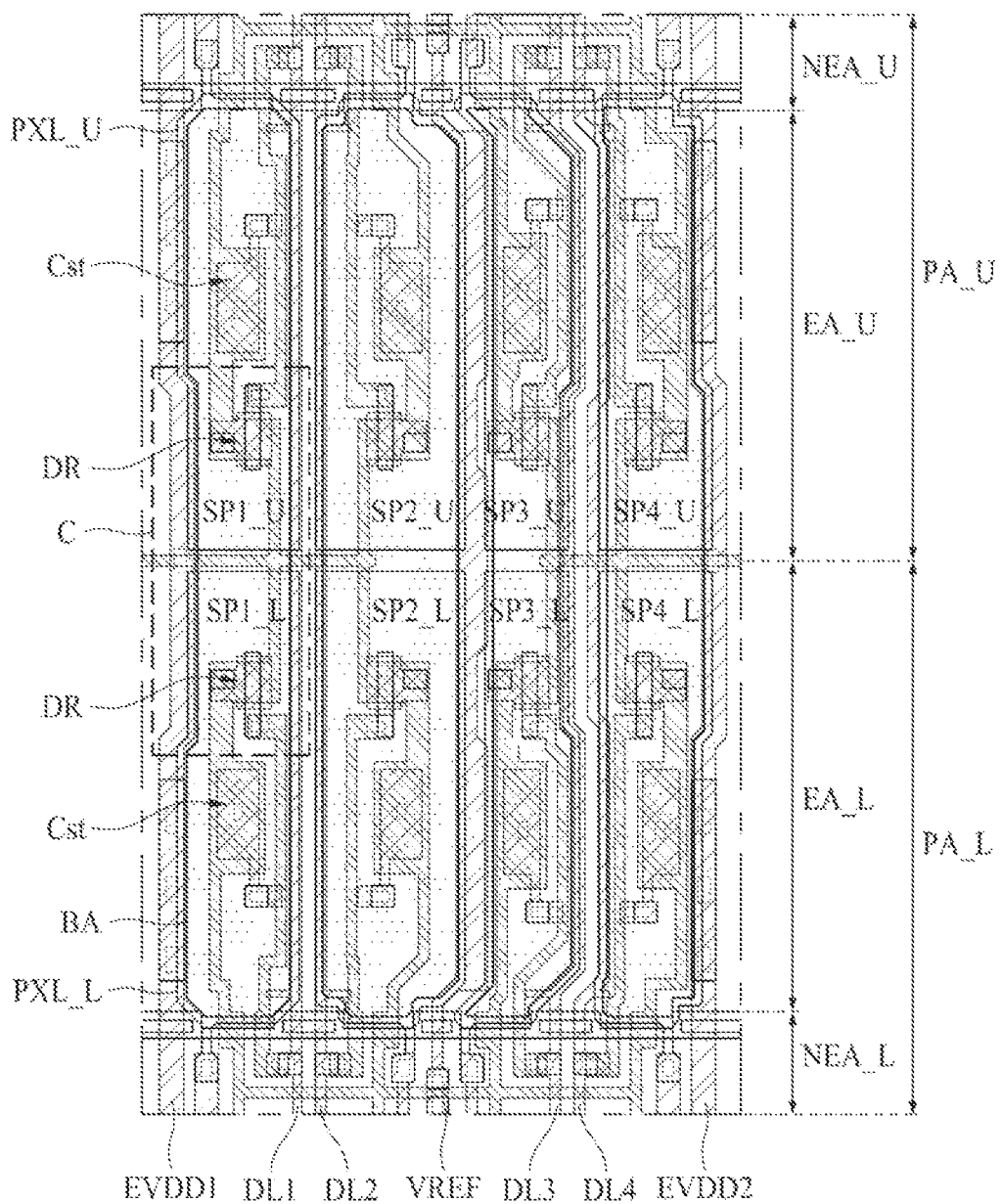
FIG. 12 is a detailed plane view illustrating a plurality of unit pixels of a light emitting display device according to various embodiments of the present disclosure.
Figure 13:
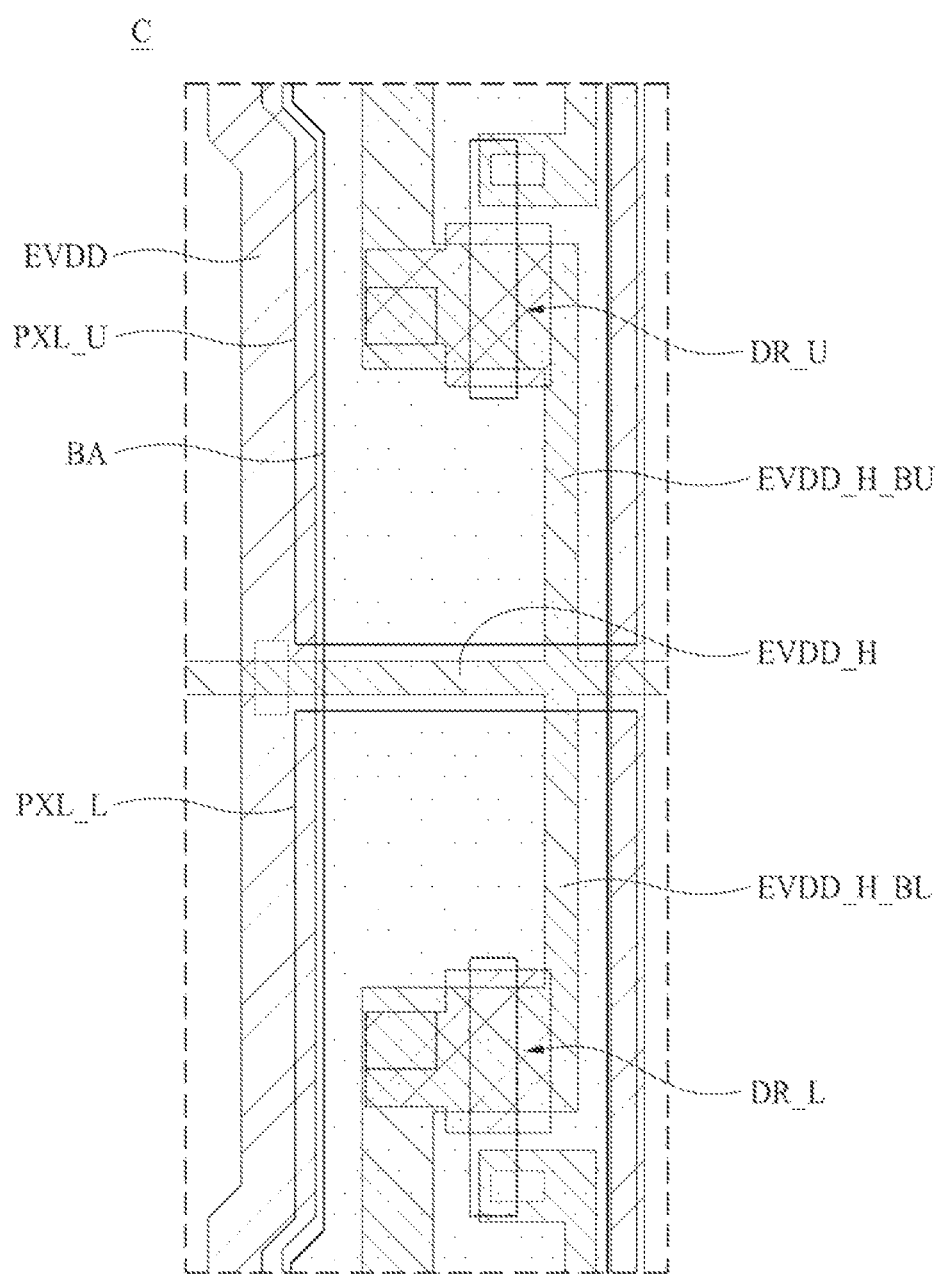
FIG. 13 is an enlarged view of a portion C of FIG. 12.

FIG. 11 is a schematic view illustrating an emission area of a plurality of subpixels of a light emitting display device according to various embodiments of the present disclosure. FIG. 12 is a detailed plane view illustrating a plurality of unit pixels of a light emitting display device according to various embodiments of the present disclosure. FIG. 13 is an enlarged view of a portion C of FIG. 12.

More specifically, FIG. 11 illustrates that the single subpixel described in FIG. 4 includes a plurality of subpixels adjacent to one another up and down, and FIGS. 12 and 13 illustrate that the single unit pixel described in FIGS. 5 to 8 include a plurality of unit pixels adjacent to one another up and down. Therefore, in the following description, elements that are not described in the light emitting display device of FIGS. 4 to 8 will be described in detail, and the other elements the same as those of FIGS. 4 to 8 will briefly be described or their repeated description will be omitted.

Referring to FIG. 11, a plurality of subpixels SPs of the light emitting display device according to various embodiments of the present disclosure can include an upper subpixel and a lower subpixel. The plurality of subpixels SPs can include an upper subpixel and a lower subpixel, which are adjacent to each other along a length direction of the data line DL. The upper subpixel and the lower subpixel can be disposed to be symmetrical to each other in a mirror shape. For example, the upper subpixel can be disposed to be opposite to the subpixel SP described in FIG. 4 up and down, and the lower subpixel can be disposed to be identical to the subpixel SP described in FIG. 4.

In the plurality of subpixels SPs, the upper subpixel can include an upper pixel area PA_U having an upper emission area EA_U and a non-emission area NEA, the lower subpixel can include a lower pixel area PA_L having a lower emission area EA_L and the non-emission area NEA. The upper emission area EA_U and the lower emission area EA_L in the plurality of subpixels SPs can opening areas defined by a common bank BA. For example, the bank BA can define an opening area where the upper emission area EA_U and the lower emission area EA_L are communicated with each other, without delimiting the upper subpixel and the lower subpixel. The non-emission area NEA in the plurality of subpixels SPs can be a cover area covered by the bank BA. For example, the non-emission area NEA of the upper subpixel can be positioned at the upper portion, and the non-emission area NEA of the lower subpixel can be positioned at the lower portion.

The plurality of subpixels SPs can be any one of red subpixels R, blue subpixels B, white subpixels W or green subpixels G in accordance with colors of light emitted (image display) through an upper emission area EA_U and a lower emission area EA_L. The color of light emitted through the upper emission area EA_U can be equal to that of light emitted through the lower emission area EA_L.

Referring to FIG. 12, the light emitting display device according to various embodiments of the present disclosure can include a pixel array that includes four upper subpixels SP1_U, SP2_U, SP3_U and SP4_U disposed at an upper portion to constitute one unit pixel, and four lower subpixels SP1_L, SP2_L, SP3_L and SP4_L disposed at a lower portion to constitute one unit pixel.

The gate line and the data lines DL1, DL2, DL3 and DL4 can be disposed in each of an upper pixel area PA_U of the upper subpixels SP1_U, SP2_U, SP3_U and SP4_U and a lower pixel area PA_L of the lower subpixels SP1_L, SP2_L, SP3_L and SP4_L, and the first electrode PXL_U of the light emitting diode, the driving thin film transistor DR, the capacitor Cst, the switching thin film transistor SW (or first switching thin film transistor) and the sensing thin film transistor ST (or second switching thin film transistor) can be included therein.

The first electrode PXL_U of the light emitting diode, the driving thin film transistor DR and the capacitor Cst can be disposed in the upper emission area EA_U of the upper subpixels SP1_U, SP2_U, SP3_U and SP4_U, and the switching thin film transistor SW and the sensing thin film transistor ST can be disposed in the upper non-emission area NEA_U. Further, the first electrode PXL_L of the light emitting diode, the driving thin film transistor DR and the capacitor Cst can be disposed in the lower emission area EA_L of the lower subpixels SP1_L, SP2_L, SP3_L and SP4_L, and the switching thin film transistor SW and the sensing thin film transistor ST can be disposed in the lower non-emission area NEA_L. The upper emission area EA_U and the lower emission area EA_L, which are adjacent to each other along the length direction of the data line DL, can be the opening areas defined to be communicated with each other by the common bank BA. The upper non-emission area NEA_U and the lower non-emission area NEA_L, which are respectively disposed at the upper and lower portions by interposing the upper emission area EA_U and the lower emission area EA_L, can be the cover areas covered by the bank BA. The power sharing line EVDD_H can be disposed between the upper subpixels SP1_U, SP2_U, SP3_U and SP4_U and the lower subpixels SP1_L, SP2_L, SP3_L and SP4_L.

As shown in FIG. 13, the emission areas EA_U and EA_L of the upper subpixel and the lower subpixel, which are adjacent to each other along the length direction of the data line DL, can be communicated with each other. One side of the first electrode PXL_U disposed in the upper subpixel and the other side of the first electrode PXL_L disposed in the lower subpixel can be exposed to or disposed in the emission area EA. For example, one side (e.g., lower side of the upper subpixel) of the first electrode PXL_U of the upper portion and the other side (e.g., upper side of the lower subpixel) of the first electrode PXL_L of the lower portion can be exposed through the opening area defined by the bank BA without being covered by the bank BA.

The power sharing line EVDD_H can be disposed between the upper subpixels SP1_U, SP2_U, SP3_U and SP4_U and the lower subpixels SP1_L, SP2_L, SP3_L and SP4_L. The power sharing line EVDD_H can be connected to the driving power line EVDD parallel with the data line DL, and can be extended from the driving power line EVDD in a horizontal direction. The power sharing line EVDD_H can be disposed one side (e.g., lower side of the upper subpixel) of the first electrode PXL_U of the upper portion and the other side (e.g., upper side of the lower subpixel) of the first electrode PXL_L of the lower portion. The power sharing line EVDD_H can include an upper branch power pattern EVDD_H_BU connected to the driving thin film transistor DR_U of the upper subpixel and the lower branch power pattern EVDD_H_BL connected to the driving thin film transistor DR_L of the lower subpixel. For example, the power sharing line EVDD_H can commonly be connected to a second source/drain electrode of the upper driving thin film transistor DR_U through the upper branch power pattern EVDD_H_BU and a second source/drain electrode of the lower driving thin film transistor DR_L through the lower branch power pattern EVDD_H_BL. The power sharing line EVDD_H, the upper branch power pattern EVDD_H_BU and the lower branch power pattern EVDD_H_BL can be formed by conductorization of active layers extended from the active layer of the driving thin film transistor DR.

In the light emitting display device according to embodiments of the present disclosure of the present disclosure, the emission areas EA_U and EA_L of each of the upper subpixels SP1_U, SP2_U, SP3_U and SP4_U and the lower subpixels SP1_L, SP2_L, SP3_L and SP4_L are communicated with each other, and can share the power sharing line EVDD_H formed by conductorization of a transparent active layer between the upper subpixels SP1_U, SP2_U, SP3_U and SP4_U and the lower subpixels SP1_L, SP2_L, SP3_L and SP4_L, whereby an aperture ratio can be increased.

The light emitting display device according to various embodiments of the present disclosure can be described as follows.

The light emitting display device according to various embodiments of the present disclosure can comprise a substrate, a pixel area having an emission area and a non-emission area on the substrate, a light emitting diode disposed in the pixel area, and a pixel driving circuit electrically connected with the light emitting diode, having a driving thin film transistor disposed in the emission area, wherein light emitted from the light emitting diode can be emitted to the outside of the substrate by passing through the substrate.

In the light emitting display device according to various embodiments of the present disclosure, the pixel driving circuit can include a switching circuit disposed in the non-emission area, and a capacitor formed between the driving thin film transistor and the switching circuit.

In the light emitting display device according to various embodiments of the present disclosure, the driving thin film transistor can include a gate electrode connected to the switching circuit, a first source/drain electrode connected to the light emitting diode, and a second source/drain electrode connected to a driving power line.

In the light emitting display device according to various embodiments of the present disclosure, the gate electrode can be extended to be parallel with the driving power line.

In the light emitting display device according to various embodiments of the present disclosure, the first source/drain electrode and the second source/drain electrode can be made of transparent active layers.

The light emitting display device according to various embodiments of the present disclosure can comprise a substrate including a pixel area having an emission area and a non-emission area, a light emitting diode having a first electrode disposed in the emission area, and a pixel driving circuit electrically connected to the first electrode of the light emitting diode, wherein the pixel driving circuit can include a switching circuit disposed in the non-emission area, a driving thin film transistor overlapped with the emission area and connected to the switching circuit and the light emitting diode, and a capacitor disposed in the emission area and formed between the switching circuit and the driving thin film transistor.

In the light emitting display device according to various embodiments of the present disclosure, the substrate can further include a gate line, a data line and a reference line, which are connected to the switching circuit, and the switching circuit can include a first switching thin film transistor connected to a gate electrode of the driving thin film transistor and the data line, and a second switching thin film transistor connected to a first source/drain electrode of the driving thin film transistor and the reference line, and the gate line can be a gate electrode of each of the first switching thin film transistor and the second switching thin film transistor.

In the light emitting display device according to various embodiments of the present disclosure, the capacitor can include a first capacitor electrode connected between the first source/drain electrode of the driving thin film transistor and the second switching thin film transistor, and a second capacitor electrode connected between the gate electrode of the driving thin film transistor and the first switching thin film transistor and overlapped with the first capacitor electrode.

In the light emitting display device according to various embodiments of the present disclosure, the first capacitor electrode can include a first active line connected between the first source/drain electrode of the driving thin film transistor and the second switching thin film transistor, and a protrusion protruded from the first active line, and the second capacitor electrode can include a second active line connected between the gate electrode of the driving thin film transistor and the first switching thin film transistor, an electrode pattern overlapped with the protrusion of the first capacitor electrode, and an electrode connector connecting the electrode pattern with the second active line.

In the light emitting display device according to various embodiments of the present disclosure, the electrode connector can include a contact hole exposing one side of the electrode pattern and one side of the second active line, and a connection pattern disposed on the contact hole and electrically connected to one side of the electrode pattern and one side of the second active line.

In the light emitting display device according to various embodiments of the present disclosure, the first active line and the second active line can be disposed in parallel with each other, and the protrusion of the first capacitor electrode can be disposed between the first active line and the second active line.

In the light emitting display device according to various embodiments of the present disclosure, the first capacitor electrode can be disposed on the same layer as the first source/drain electrode of the driving thin film transistor or made of the same material as that of the first source/drain electrode of the driving thin film transistor.

The light emitting display device according to various embodiments of the present disclosure can further comprise at least one first insulating layer disposed between the first capacitor electrode and the second capacitor electrode, and at least one second insulating layer disposed between the first capacitor electrode and the first electrode of the light emitting diode, wherein the first capacitor electrode can electrically be connected with the first electrode through a contact hole disposed in the at least one second insulating layer in the emission area.

In the light emitting display device according to various embodiments of the present disclosure, the second capacitor electrode can include a light shielding metal material.

The light emitting display device according to various embodiments of the present disclosure can comprise a substrate, and pixels respectively connected to gate lines and data lines on the substrate, wherein each of the pixels can include a light emitting diode including a first electrode, a driving thin film transistor disposed below the first electrode and connected to the light emitting diode, a switching circuit connected to gate and data lines adjacent thereto and the driving thin film transistor and non-overlapped with the first electrode, and a capacitor formed between the switching circuit and the driving thin film transistor.

In the light emitting display device according to various embodiments of the present disclosure, each of the pixels can include an emission area and a non-emission area near the emission area, the switching circuit can be disposed in the non-emission area, and the driving thin film transistor can be disposed in the emission area.

In the light emitting display device according to various embodiments of the present disclosure, the capacitor can be disposed in the emission area and formed between the switching circuit and the driving thin film transistor.

In the light emitting display device according to various embodiments of the present disclosure, emission areas of two pixels adjacent to each other along a length direction of the data lines can be communicated with each other, and the two adjacent pixels can be any one of red pixels, green pixels, blue pixels or white pixels.

In the light emitting display device according to various embodiments of the present disclosure, one side of the first electrode disposed in any one first pixel of the two adjacent pixels and the other side of the first electrode disposed in the other one second pixel of the two adjacent pixels can be exposed to or in the emission area.

The light emitting display device according to various embodiments of the present disclosure can further comprise a driving power line parallel with the data lines, and a power sharing line disposed between one side of the first electrode disposed in the first pixel and the other side of the first electrode disposed in the second pixel and connected to the driving power line, wherein the power sharing line can commonly be connected to a second source/drain electrode of a driving thin film transistor disposed in the first pixel and a second source/drain electrode of a driving thin film transistor disposed in the second pixel.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
a pixel area having an emission area and a non-emission area on a substrate;
a light emitting diode disposed in the pixel area; and
a pixel driving circuit electrically connected with the light emitting diode, and having a driving thin film transistor disposed in the emission area,
wherein light emitted from the light emitting diode is emitted to the outside of the substrate by passing through the substrate,
wherein the pixel driving circuit includes a switching circuit disposed in the non-emission area, and a capacitor disposed between the driving thin film transistor and the switching circuit, and
wherein the capacitor includes:
a first capacitor electrode connected between a first source/drain electrode of the driving thin film transistor and a second switching thin film transistor of the switching circuit; and
a second capacitor electrode connected between a gate electrode of the driving thin film transistor and a first switching thin film transistor of the switching circuit, and overlapped with the first capacitor electrode.

2. The light emitting display device of claim 1, wherein the driving thin film transistor includes:
the gate electrode connected to the switching circuit;
the first source/drain electrode connected to the light emitting diode; and
a second source/drain electrode connected to a driving power line.

3. The light emitting display device of claim 2, wherein the gate electrode is extended to be parallel with the driving power line.

4. The light emitting display device of claim 2, wherein the first source/drain electrode and the second source/drain electrode are made of transparent active layers.

5. A light emitting display device comprising:
a substrate including a pixel area having an emission area and a non-emission area;
a light emitting diode having a first electrode disposed in the emission area; and
a pixel driving circuit electrically connected to the first electrode of the light emitting diode,
wherein the pixel driving circuit includes:
a switching circuit disposed in the non-emission area;
a driving thin film transistor directly overlapped with the first electrode within the emission area and connected to the switching circuit and the light emitting diode; and
a capacitor disposed in the emission area and formed between the switching circuit and the driving thin film transistor.

6. The light emitting display device of claim 5, wherein the substrate further includes a gate line, a data line and a reference line, which are connected to the switching circuit, the switching circuit includes:
a first switching thin film transistor connected to a gate electrode of the driving thin film transistor and the data line; and
a second switching thin film transistor connected to a first source/drain electrode of the driving thin film transistor and the reference line, and
the gate line is a gate electrode of each of the first switching thin film transistor and the second switching thin film transistor.

7. The light emitting display device of claim 6, wherein the capacitor includes:
a first capacitor electrode connected between the first source/drain electrode of the driving thin film transistor and the second switching thin film transistor; and
a second capacitor electrode connected between the gate electrode of the driving thin film transistor and the first switching thin film transistor and overlapped with the first capacitor electrode.

8. The light emitting display device of claim 7, wherein the first capacitor electrode includes a first active line connected between the first source/drain electrode of the driving thin film transistor and the second switching thin film transistor, and a protrusion protruded from the first active line, and
the second capacitor electrode includes a second active line connected between the gate electrode of the driving thin film transistor and the first switching thin film transistor, an electrode pattern overlapped with the protrusion of the first capacitor electrode, and an electrode connector connecting the electrode pattern with the second active line.

9. The light emitting display device of claim 8, wherein the electrode connector includes:
a contact hole exposing one side of the electrode pattern and one side of the second active line; and
a connection pattern disposed on the contact hole and electrically connected to one side of the electrode pattern and one side of the second active line.

10. The light emitting display device of claim 8, wherein the first active line and the second active line are disposed in parallel with each other, and the protrusion of the first capacitor electrode is disposed between the first active line and the second active line.

11. The light emitting display device of claim 7, wherein the first capacitor electrode is disposed on the same layer as the first source/drain electrode of the driving thin film transistor or is made of a same material as that of the first source/drain electrode of the driving thin film transistor.

12. The light emitting display device of claim 11, further comprising:
   at least one first insulating layer disposed between the first capacitor electrode and the second capacitor electrode; and
   at least one second insulating layer disposed between the first capacitor electrode and the first electrode of the light emitting diode,
   wherein the first capacitor electrode is electrically connected with the first electrode through a contact hole disposed in the at least one second insulating layer in the emission area.

13. The light emitting display device of claim 12, wherein the second capacitor electrode includes a light shielding metal material.

14. The light emitting display device of claim 5, wherein the emission area is an open area defined by a bank, and the non-emission area is a cover area covered by the bank.

15. The light emitting display device of claim 5, wherein the emission area includes a first area for emitting light and a second area for not emitting light, and
   wherein the first area encircles the second area.

16. The light emitting display device of claim 15, wherein the driving thin film transistor overlaps the second area.

17. A light emitting display device comprising:
   a substrate; and
   pixels respectively connected to gate lines and data lines on the substrate,
   wherein each of the pixels includes:
   a light emitting diode including a first electrode;
   a driving thin film transistor disposed below the first electrode and connected to the light emitting diode;
   a switching circuit connected to gate and data lines adjacent thereto and the driving thin film transistor, and non-overlapped with the first electrode; and
   a capacitor disposed between the switching circuit and the driving thin film transistor,
   wherein emission areas of two pixels adjacent to each other along a length direction of the data lines are communicated with each other, and the two adjacent pixels are any one of red pixels, green pixels, blue pixels or white pixels.

18. The light emitting display device of claim 17, wherein each of the pixels includes an emission area and a non-emission area near the emission area, the switching circuit is disposed in the non-emission area, and the driving thin film transistor is disposed in the emission area.

19. The light emitting display device of claim 18, wherein the capacitor is disposed in the emission area and disposed between the switching circuit and the driving thin film transistor.

20. The light emitting display device of claim 15, wherein one side of the first electrode disposed in any one first pixel of the two adjacent pixels and the other side of the first electrode disposed in the other one second pixel of the two adjacent pixels are exposed to or in the emission area.

21. The light emitting display device of claim 20, further comprising:
   a driving power line parallel with the data lines; and
   a power sharing line disposed between one side of the first electrode disposed in the first pixel and the other side of the first electrode disposed in the second pixel and connected to the driving power line,
   wherein the power sharing line is commonly connected to a second source/drain electrode of a driving thin film transistor disposed in the first pixel and a second source/drain electrode of a driving thin film transistor disposed in the second pixel.

* * * * *